United States Patent
Lin et al.

(10) Patent No.: US 9,529,275 B2
(45) Date of Patent: Dec. 27, 2016

(54) LITHOGRAPHY SCANNER THROUGHPUT

(75) Inventors: Chien-Hsun Lin, Hsinchu (TW); An-Kao Yang, Hsin-Chu (TW); Jui-Chung Peng, Hsin-Chu (TW); Yao-Wen Guo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1567 days.

(21) Appl. No.: 11/677,320

(22) Filed: Feb. 21, 2007

(65) Prior Publication Data
US 2008/0198351 A1    Aug. 21, 2008

(51) Int. Cl.
G03B 27/58    (2006.01)
G03F 7/20    (2006.01)

(52) U.S. Cl.
CPC ....... *G03F 7/70358* (2013.01); *G03F 7/70425* (2013.01); *G03F 7/70466* (2013.01)

(58) Field of Classification Search
CPC .............. G03F 7/70358; G03F 7/70425; G03F 7/70466; G03F 7/70458; G03F 7/70533; G03F 7/70758; G03F 7/70775; G03F 7/70716; G03F 7/70725
USPC .......... 355/53, 77, 67–71, 72–75; 250/492.1, 250/492.2, 492.22, 548; 430/8, 30, 311, 5, 22, 430/322; 716/54, 55
IPC .................... G03F 7/70358, 7/70425, 7/70466, 7/70458, 7/70533, 7/70758, 7/70775, 7/70716, 7/70725
See application file for complete search history.

(56) References Cited

U.S. PATENT DOCUMENTS

| | | | | |
|---|---|---|---|---|
| 4,910,549 A | * | 3/1990 | Sugita | 355/53 |
| 5,168,304 A | * | 12/1992 | Hattori | 355/50 |
| 5,461,237 A | * | 10/1995 | Wakamoto et al. | 250/548 |
| 5,575,706 A | * | 11/1996 | Tsai et al. | 438/693 |
| 5,617,182 A | * | 4/1997 | Wakamoto et al. | 355/53 |
| 5,699,260 A | * | 12/1997 | Lucas et al. | 700/121 |
| 5,793,471 A | * | 8/1998 | Kanda et al. | 355/53 |
| 5,811,211 A | * | 9/1998 | Tanaka et al. | 430/30 |
| 5,960,305 A | * | 9/1999 | Kumar | 438/598 |
| 5,994,003 A | * | 11/1999 | Hara et al. | 430/5 |
| 6,015,975 A | * | 1/2000 | Kawakami et al. | 250/492.22 |
| 6,104,035 A | * | 8/2000 | Muraki | 250/492.22 |

(Continued)

FOREIGN PATENT DOCUMENTS

| | | | | |
|---|---|---|---|---|
| JP | 06020903 A | * | 1/1994 | H01L 21/027 |
| JP | 11-168042 | | 6/1999 | |

(Continued)

OTHER PUBLICATIONS

English translation of JP 06-020903A, published on Jan. 28, 1994.*

*Primary Examiner* — Christina Riddle
(74) *Attorney, Agent, or Firm* — Haynes and Boone, LLP

(57) ABSTRACT

A method for use in the manufacture of a microelectronic apparatus, the method comprising exposing a dummy field on a substrate by utilizing a lithographic scanner at a first speed, and exposing a production field on the substrate by utilizing the lithographic scanner at a second speed, where the first speed is substantially greater than the second speed. In a related embodiment, a method for use in the manufacture a microelectronic apparatus comprises exposing a noncritical layer of the apparatus by utilizing a lithographic scanner at a first speed, and exposing a critical layer of the apparatus by utilizing the lithographic scanner at a second speed, where the first speed is substantially greater than the second speed.

22 Claims, 3 Drawing Sheets

(56) References Cited

U.S. PATENT DOCUMENTS

| | | |
|---|---|---|
| 6,195,155 B1 * | 2/2001 | Kawai ................ 355/53 |
| 6,381,004 B1 * | 4/2002 | Hagiwara et al. ............. 355/53 |
| 6,424,405 B2 * | 7/2002 | Kurosawa et al. ............. 355/53 |
| 6,573,976 B2 * | 6/2003 | Takeishi .......................... 355/55 |
| 6,934,008 B2 * | 8/2005 | Lin ................................. 355/53 |
| 6,980,917 B2 * | 12/2005 | Ward et al. ................... 702/120 |
| 7,002,165 B2 | 2/2006 | Lin |
| 7,016,013 B2 | 3/2006 | Van Der Biggelaar et al. |
| 7,019,815 B2 | 3/2006 | Jasper et al. |
| 7,034,921 B2 | 4/2006 | Tanaka |
| RE39,083 E | 5/2006 | Nishi |
| 7,057,705 B2 | 6/2006 | Heintze |
| 2001/0031407 A1 * | 10/2001 | Okino et al. .................... 430/30 |
| 2002/0186359 A1 * | 12/2002 | Meisburger et al. ........... 355/69 |
| 2003/0147060 A1 * | 8/2003 | Tokuda et al. ................. 355/53 |
| 2003/0183860 A1 * | 10/2003 | Uchiyama et al. ........... 257/296 |
| 2004/0032575 A1 | 2/2004 | Nishi et al. |
| 2004/0043311 A1 | 3/2004 | McCullough et al. |
| 2004/0156028 A1 | 8/2004 | Okada |
| 2005/0007572 A1 | 1/2005 | George et al. |
| 2006/0001852 A1 * | 1/2006 | Lee et al. ......................... 355/53 |
| 2006/0094246 A1 * | 5/2006 | Whitefield et al. ........... 438/725 |
| 2006/0119812 A1 | 6/2006 | Kruijswijk et al. |
| 2006/0119820 A1 * | 6/2006 | Hirukawa ....................... 355/53 |
| 2006/0139591 A1 * | 6/2006 | Jung ................................ 355/53 |
| 2007/0013893 A1 * | 1/2007 | Loopstra ........................ 355/72 |
| 2007/0048668 A1 * | 3/2007 | Liegl ............................. 430/311 |
| 2007/0229789 A1 * | 10/2007 | Kawamura ..................... 355/53 |
| 2008/0106712 A1 * | 5/2008 | Nagasaka ....................... 355/30 |

FOREIGN PATENT DOCUMENTS

| | | |
|---|---|---|
| JP | 2001-291662 | 10/2001 |
| JP | 2004-311639 | 4/2004 |
| WO | WO 2004021269 A1 * | 3/2004 |

* cited by examiner

LITHOGRAPHY SCANNER THROUGHPUT

BACKGROUND

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist).

In general, a single substrate will contain a network of adjacent target portions that are successively exposed. One type of lithographic apparatus is a scanner, in which each target portion is exposed by scanning a pattern reticle through a projection beam in a given direction (the "scanning" direction), while synchronously scanning the wafer substrate parallel or anti-parallel to this direction. Successful scanning requires extremely precise synchronization between the moving reticle and wafer stages during the exposure. For example, the scanning speed of a scanner is a key factor affecting quality and throughput.

During processing, some critical layers may require lithography steps to expose a dummy image near wafer edges. The dummy image exposures can account for 20% or more of the total layer exposure time. Generally, a maximum scanning speed is selected for the exposure of a single layer. Moreover, a maximum scanning speed is often selected for use with both critical and non-critical layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
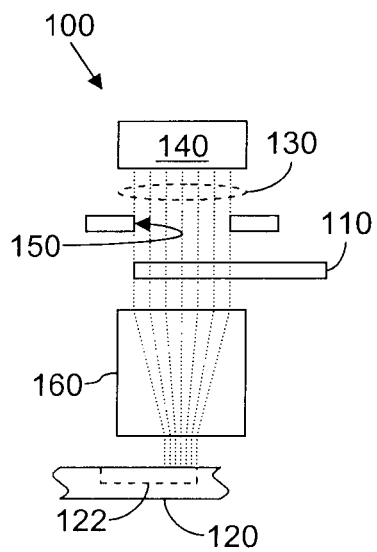
FIGS. 1a-1c are schematic views of at least a portion of apparatus demonstrating one or more aspects of the present disclosure.

The following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
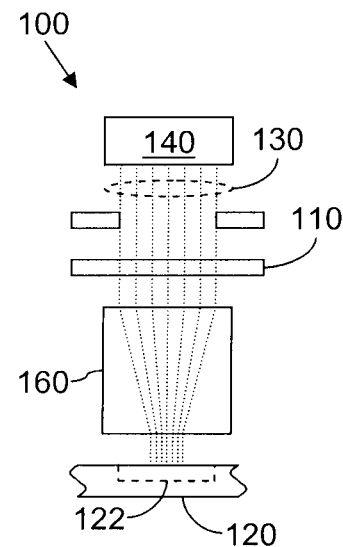
Figure 1C:
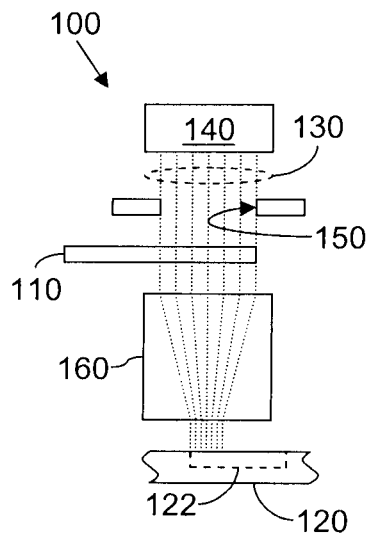

Referring to FIGS. 1a-1c, collectively, illustrated are schematic views of at least a portion of an apparatus 100 demonstrating one or more aspects of the present disclosure. The apparatus 100 may be or include a lithographic scanner configured to transfer a pattern from a reticle 110 to an exposure field 122 on a substrate or wafer 120 (hereafter collectively referred to as a substrate 120). Light 130 from a light source or other illumination means 140 passes through an exposure slit 150 before passing through the reticle 110. The exposure slit 150 may be about as wide as the intended exposure field 122 on the substrate 120, but may only be a fraction of its length. The light 130 then passes through a reduction apparatus 160 configured to reduce the image of the reticle by, for example, 4×, 5×, or otherwise. The light 130 then impinges on the exposure field 122.

During the above exposure process, the reticle 110 and the substrate 120 may be moving relative to each other. The relative speed of the reticle 110 and the substrate 120 may be referred to herein as the scanner speed or the lithographic scanner speed. This speed may result from movement of either of the reticle 110 and the substrate 120 relative to each other, the positionally-fixed exposure slit 150, and/or the positionally-fixed reduction apparatus 160. For example, the reticle 110 may remain positionally-fixed relative to the exposure slit 150 and reduction apparatus 160 while the substrate 120 is translated relative to the exposure slit 150 and reduction apparatus 160, whether in the X-direction (sideways across the page in FIGS. 1a-1c), the Y-direction (into or out of the page in FIGS. 1a-1c), and/or the Z-direction (up or down across the page in FIGS. 1a-1c). Alternatively, the substrate 120 may remain positionally-fixed relative to the exposure slit 150 and reduction apparatus 160 while the reticle 110 is translated relative to the exposure slit 150 and reduction apparatus 160, whether in the X-, Y-, and/or Z-directions. However, as depicted in the series of FIGS. 1a-1c, both the reticle 110 and the substrate 120 may be translated relative to the exposure slit 150 and reduction apparatus 160, whether in X-, Y-, and/or Z-directions.

For example, in FIG. 1a, the left end of the reticle 110 and the right end of the exposure field 122 are introduced into the light 130. Then, as shown in FIG. 1b, a middle portion of the reticle 110 and a middle portion of the exposure field 122 are exposed to the light 130, as the result of translation of the reticle 110 towards the left side of the page (in the negative X-direction) and translation of the substrate 120 towards the right side of the page (in the positive X-direction). Then, as shown in FIG. 1c, the right end of the reticle 110 and the left end of the exposure field 122 are exposed to the light 130, as the result of further translation of the reticle 110 towards the left side of the page and further translation of the substrate 130 towards the right side of the page.

It is noted that the exposure field 122 and the illustrated portion of the reticle 110 that is utilized to expose the exposure field 122 do not necessarily have the same dimension in the direction of translation (i.e., in the X-direction, left and right across the page). Thus, the speed at which the reticle 110 is translated during exposure of the exposure field 122 may not necessarily be the same speed at which the substrate 120 is translated during exposure of the exposure field 122, both relative to the positionally-fixed exposure slit 150 and reduction apparatus 160. However, what may be of greater importance is the relative speed of the reticle 110 and the substrate 120, as will be described further below. It is also noted that the reticle 110 and substrate 120 may not necessarily be translated in anti-parallel directions during exposure of the exposure field 122, as depicted in FIGS. 1*a*-1*c*. For example, the reticle 110 and substrate 120 may alternatively be translated in substantially parallel directions during exposure of the exposure field 122.

In the above description, the "left" and "right" references are to the page on which FIGS. 1*a*-1*c* are printed, and are used merely for the sake of convenience and clarity in describing aspects of the present disclosure. Such references are not intended to be limiting to the scope of the present disclosure.

There may be many factors that influence the determination of the scanner speed. For example, a hypothetical microelectronic device may require the lithographic scanning jobs set forth in Table 1 below.

TABLE 1

Hypothetical Scanning Jobs

| Scanning Job | Layer | Image | XY Spec. | Z Spec. | Energy Spec. |
|---|---|---|---|---|---|
| 1 | A11 | B1 | XY1 | Z1 | E1 |
| 2 | A11 | B2 | XY3 | Z5 | E3 |
| 3 | A12 | B1 | XY1 | Z1 | E1 |
| 4 | A12 | B2 | XY1 | Z1 | E1 |
| 5 | A12 | B3 | XY5 | Z5 | E5 |
| 6 | A12 | B4 | XY5 | Z5 | E5 |
| 7 | A13 | B1 | XY5 | Z5 | E3 |

As shown in Table 1, a scanning job may have multiple specifications upon which the scanner speed may be dependent. For example, in Table 1 above, scanning job 6 comprises exposing image B4 on layer A12, which corresponds to each of an XY5 specification, a Z5 specification, and an E5 specification. Each of these specifications may have a corresponding maximum, minimum or otherwise preferred scanner speed, as in the hypothetical examples set forth in Tables 2-4 below.

TABLE 2

XY-Speed Ranges

| Specification | Speed Range |
|---|---|
| XY1 | S11 |
| XY2 | S12 |
| XY3 | S13 |
| XY4 | S14 |
| XY5 | S15 |
| XY6 | S16 |

TABLE 3

Z-Speed Ranges

| Specification | Speed Range |
|---|---|
| Z1 | S21 |
| Z2 | S22 |
| Z3 | S23 |
| Z4 | S24 |
| Z5 | S25 |
| Z6 | S26 |

TABLE 4

Energy-Speed Ranges

| Specification | Speed Range |
|---|---|
| E1 | S31 |
| E2 | S32 |
| E3 | S33 |
| E4 | S34 |
| E5 | S35 |
| E6 | S36 |

If it is desired that a particular scanning job be performed as quickly as possible, such as to improve production throughput, for example, the maximum scanning speed which may satisfactorily complete the scanning job may be selected. Continuing with the example of scanning job 6 discussed above, the speed range for the scanning job must be selected from S15, the speed range for the XY5 specification, S25, the speed range for the Z5 specification, and S35, the speed range for the E5 specification. In this example, the S35 speed range is larger (in velocity) than the S25 speed range, which is larger than the S15 speed range. Thus, for the scanning job 6, the larger (fastest) scanning speed which satisfies the XY5, Z5 and E5 specifications is the S15 speed range.

However, a single scanner speed may be employed when exposing all of the patterns of a single layer. For example, in Table 1 above, each of the scanning jobs 3-6 may be required to use the same scanner speed. Thus, for example, if the slowest scanning speed for scanning jobs 3 and 4 is the S11 speed range, and the slowest scanning speed for scanning jobs 5 and 6 is the S15 speed range, where the S15 speed range is faster than the S11 speed range, then the S11 speed range may be used for all of scanning jobs 3-6 because the jobs each comprise exposing a portion of the same manufacturing layer.

Figure 2:
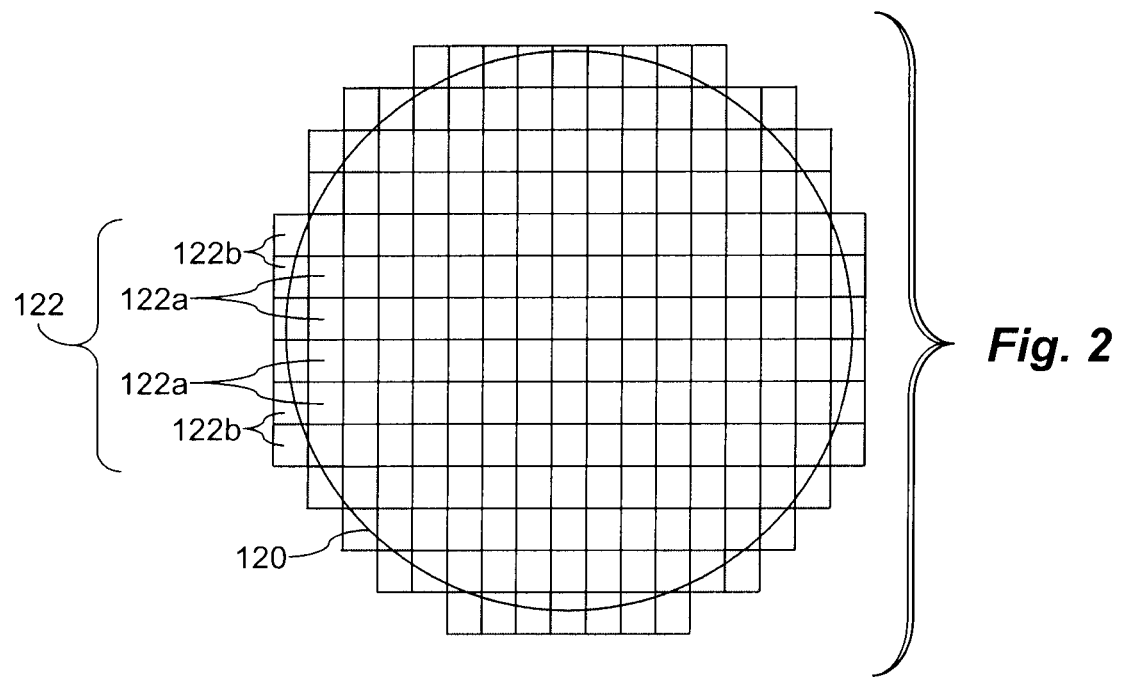
FIG. 2 is a top view of at least a portion of apparatus demonstrating one or more aspects of the present disclosure.

To further demonstrate this aspect, FIG. 2 is a top view of the substrate 120 shown in FIGS. 1*a*-1*c*. The substrate 120 is subdivided into a plurality of exposure areas collectively referred to herein as exposure areas 122. The exposure areas 122 include production exposure areas 122*a*, which are un-shaded in FIG. 2, and dummy exposure areas 122*b*, which overlap the boundary of the substrate 120 and are shaded in FIG. 2. For the sake of clarity, only a few of each of the exposure areas 122*a* and 122*b* have been labeled in FIG. 2. The production exposure areas 122*a* correspond to areas of the substrate 120 which are intended to be used in production units. However, the dummy exposure areas 122*b* are intended to be discarded and not used in production units, and are merely included to improve yield of the production units.

As described above, a single scanning speed may be selected for exposing all of the exposure areas 122 of a single layer being formed on the substrate 120. However, if the scanner speed employed when exposing the dummy exposure areas 122*b* is increased, then the total time required for exposing the layer comprising the exposure areas may be decreased, thus increasing throughput of the scanning procedure. That is, if the scanner speed utilized to expose the dummy exposure areas 122*b* is substantially greater than the scanner speed utilized to expose the production exposure areas 122*a*, then the total scanning time for the layer comprising the exposure areas 122 may be decreased. For example, the scanner speed utilized to expose the dummy exposure areas 122*b* may be at least about 50% greater than the scanner speed utilized to expose the production exposure areas 122*a*.

Consider the example where there are 58 dummy exposure areas 122*b* and there are 142 production exposure areas 122*a*, for a total of 200 exposure areas 122, as illustrated in FIG. 2. If the scanner speed utilized to expose the dummy exposure areas 122*b* is at least about 100% greater than the scanner speed utilized to expose the production exposure areas 122*a*, then the total time required to expose the layer comprising the exposure areas 122 may be reduced by at least about 9.5% compared to processing all of the exposure areas 122 when utilizing the scanner speed that is utilized to scan the production exposure areas 122*a*. For example, the scanner speed utilized to scan the production exposure areas 122*a* may be about 360 mm/second, whereas the scanner speed utilized to scan the dummy exposure areas 122*b* may be about 720 mm/sec. If the number of dummy exposure areas 122*b* is a greater percentage of the total number of exposure areas 122 of a single layer, then even greater time savings may be accomplished by utilizing a faster scanner speed when exposing the dummy exposure areas 122*b* relative to the scanner speed utilized to expose the production exposure areas 122*a*.

Figure 3:
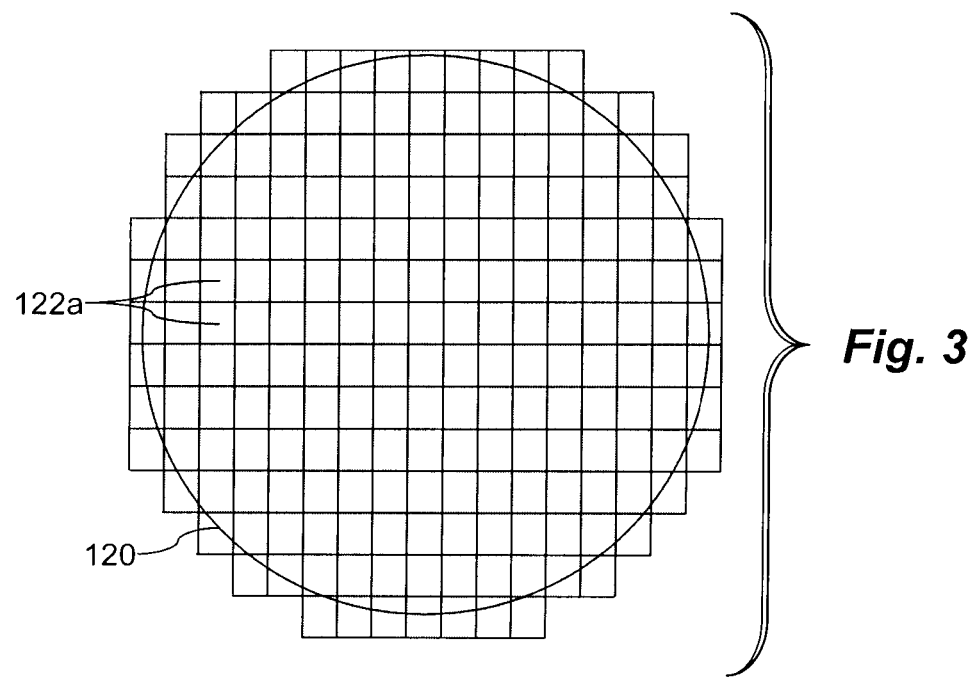
FIG. 3 is a top view of at least a portion of apparatus demonstrating one or more aspects of the present disclosure.

Referring to FIG. 3, illustrated is a top view of the substrate 120 shown in FIG. 2 in a different stage of manufacture in which a different layer is being lithographically exposed. The layer being exposed in FIG. 3 may be a non-critical layer compared to the layer being exposed in FIG. 2. For example, the accuracy of overlay and/or dose of the layer being exposed in FIG. 3 may be greater than 10%, whereas the accuracy of overlay and/or dose of the layer being exposed in FIG. 2 may smaller than 3%.

As described above, a single scanning speed may be selected for exposing all of the exposure areas 122 of a single layer being formed on the substrate 120. However, if the scanner speed employed when exposing the exposure areas 122 of a non-critical layer is increased, relative to the scanner speed employed when exposing the exposure areas 122 of a critical layer, then the total time required for exposing the non-critical layers (and therefore all of the layers, cumulatively) may be decreased, thus increasing throughput of the scanning procedure. That is, if the scanner speed utilized to expose the exposure areas 122 of a non-critical layer is substantially greater than the average scanner speed utilized to expose the exposure areas 122 of a critical layer, then the total scanning time for the all of the layers may be decreased. For example, the scanner speed utilized to expose the exposure areas 122 of a non-critical layer may be at least about 50% greater than the average scanner speed utilized to expose the exposure areas 122 of a critical layer. Or, the scanner speed utilized to expose the exposure areas 122 of a non-critical layer may be at least about 50% greater than the slowest scanner speed utilized to expose any one exposure area 122 of a critical layer (such as one of the exposure areas 122*a* of FIG. 2).

Consider the example where there are 200 exposure areas 122 of a non-critical layer, as illustrated in FIG. 3. If the scanner speed utilized to expose the exposure areas 122 of the non-critical layer is at least about 100% greater than the slowest scanner speed utilized to expose any one of the exposure areas 122 of a critical layer, then the total time required to expose all of the exposure areas 122 of the non-critical layer may be reduced by at least about 50% compared to processing all of the exposure areas 122 of the non-critical layer when utilizing the slowest scanner speed that is utilized to scan any one of the exposure areas 122 of a critical layer. For example, the slowest scanner speed utilized to scan any one of the exposure areas 122 of a critical layer may be about 360 mm/second, whereas the scanner speed utilized to scan the exposure areas 122 of a non-critical layer may be about 720 mm/sec.

Figure 4:
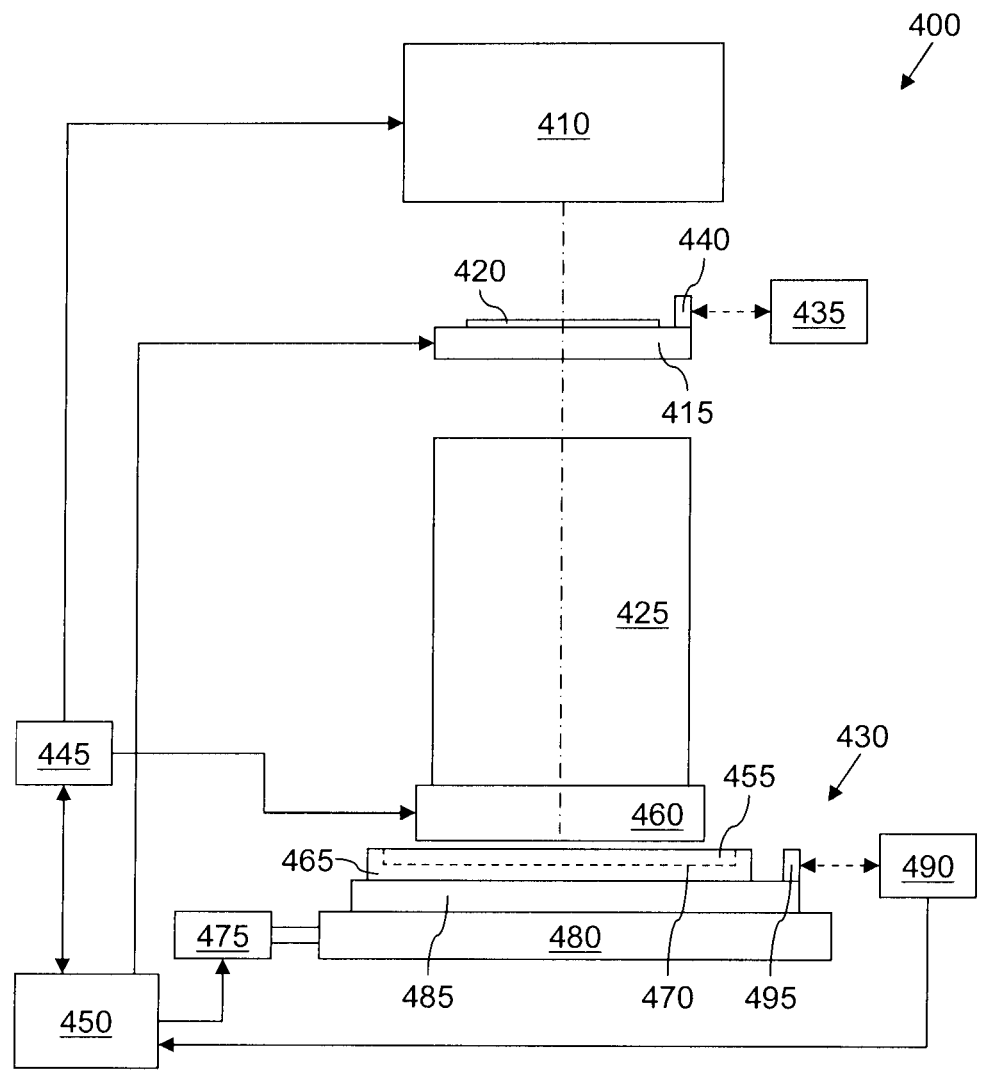
FIG. 4 is a schematic view of at least a portion of apparatus demonstrating one or more aspects of the present disclosure.

Referring to FIG. 4, illustrated is a schematic view of at least a portion of apparatus 400 demonstrating one or more aspects of an environment in which one or more aspects of the present disclosure may be implemented. The apparatus 400 may be, include, or be included in a lithography system according to one or more aspects of the present disclosure.

The apparatus 400 comprises an illumination system 410, a reticle stage 415 configured to hold a reticle 420, a projection unit 425, and a stage unit 430. Among other possible components, the illumination system 410 may include a light source, an illuminance uniformity optical system (such as may include an optical integrator or the like), a beam splitter, a relay lens, a filter, and/or a reticle blind (none of which are shown). In illumination system 410, an illumination or exposure light illuminates through an exposure slit (such as may be set by the reticle blind) and onto the reticle 420 where the circuit pattern or the like is fabricated with substantially uniform illuminance. The illumination or exposure light may comprise an ArF excimer laser beam (e.g., wavelength of 193 nm), a far ultraviolet light such as the KrF excimer laser beam (e.g., wavelength of 248 nm), or bright lines in the ultraviolet region generated by an ultra high-pressure mercury lamp (such as the g-line or the i-line), among others. The illumination system 410 may also comprise a fly-eye lens, a rod integrator (an internal reflection type integrator), and/or a diffraction optical element, such as may be a component of the optical integrator.

The reticle 420 is secured to the reticle stage 415 by vacuum, for example. The reticle stage 415 may be drivable in an XY plane perpendicular to the optical axis of the illumination system 410 by a reticle stage drive section, such as may comprise one or more linear motors or other motion-inducing components. The reticle stage 415 may be drivable in a predetermined scanning direction, such as along the Y-axis shown in FIG. 4. Such scanning may be as described above with respect to FIGS. 1*a*-1*c*, 2 and 3.

The position of reticle stage 415 within its moving plane of the stage may be detected periodically or at all times via a reticle laser interferometer 435 via a movable mirror 440, possibly at a resolution of ranging between about 0.5 nm and about 1.0 nm. The reticle stage 415 may comprise a movable mirror that has a reflection surface orthogonal to the Y-axis direction and another movable mirror that has a reflection surface orthogonal to an X-axis direction, as well as a reticle Y interferometer and a reticle X interferometer corresponding to such mirrors. However, in FIG. 4, such an embodiment and others are schematically represented by movable mirror 440 and reticle interferometer 435.

Information describing the position of the reticle stage 415 may be communicated from reticle interferometer 435 to a main controller 445, such as via a stage control unit 450. The stage control unit 450 may be configured to drive and/or control the reticle stage 415 via the reticle stage drive section, based on the positional information of the reticle stage 415 and in response to instructions from the main controller 445.

The optical axis of the projection unit 425 may coincide with the optical axis of the illumination system 410. The projection unit 425 may comprises a barrel-shaped structure housing a projection optical system that includes a plurality of lenses, lens elements, and/or other optical elements which share the same optical axis in the Z-axis direction and are held at a predetermined positional relationship within the housing. For example, a both-side telecentric dioptric system having a predetermined projection magnification (e.g., ¼× or ⅕×) may be employed. Accordingly, when exposure light from the illumination system 410 illuminates the illumination area on the reticle 420, the illumination light that passes through the reticle 420 may the pass through the projection unit 425 and form a reduced image of the circuit pattern within the illumination area on the reticle 420 (a partial reduced image of the circuit pattern) on the wafer or substrate 455, whose surface may be coated with a resist and/or other photosensitive material.

The apparatus 400 may also comprise a liquid supply/drainage unit 460, such that the apparatus 400 may be configured for use in immersion lithography processing. The liquid supply/drainage unit 32 may be attached to the projection unit 425 so that it surrounds the lower end of the projection unit 425.

The stage unit 430 may comprise a wafer stage 465 which may serve as a substrate stage, a wafer holder 470 provided on the wafer stage 465, and a wafer stage drive section 475 which is configured to drive the wafer stage 465 and wafer holder 470. The wafer stage 465 comprises an XY stage 480, such as may be driven in the XY direction by linear motors and/or other components. The wafer stage 465 also comprises a Z stage 485, such as may be mounted on the XY stage 480 and may be configured to provide movement in the Z-axis direction and/or in an inclination direction with respect to the XY plane (the rotational direction around the X-axis ($\Omega_X$) and the rotational direction around the Y-axis ($\Omega_Y$)), such as by a Z tilt drive mechanism. The XY stage 480 may also be configured to be movable not only in the scanning direction (the Y-axis direction) but also in a non-scanning direction (the X-axis direction) perpendicular to the scanning direction.

The XY stage 480 and the Z stage 485 may be collectively referred to as a wafer stage. The position of wafer stage within the XY plane, possibly including rotation around the Z-axis ($\Omega_Z$) is detected periodically or at all times by a wafer laser interferometer 490, such as via a movable mirror 495 provided on the upper surface of the Z tilt stage 485, possibly at a resolution ranging between about 0.5 nm and about 1 nm, for example. Such configuration may also comprise a dual-mirror, dual-interferometer configuration as described above with regard to the reticle stage 415.

Positional and/or velocity (speed) information regarding the wafer stage may be communicated to the stage control unit 450, and then to main controller 445. The stage control unit 450 may be configured to control the wafer stage via the wafer stage drive section 475 based on the positional and/or velocity information of the wafer stage, such as in response to instructions from the main controller 445.

Thus, the present disclosure introduces a method for use in the manufacture of a microelectronic apparatus, the method comprising exposing a dummy field on a substrate by utilizing a lithographic scanner at a first speed, and exposing a production field on the substrate by utilizing the lithographic scanner at a second speed, where the first speed is substantially greater than the second speed.

Another method for use in the manufacture a microelectronic apparatus introduced in the present disclosure comprises exposing a non-critical layer of the apparatus by utilizing a lithographic scanner at a first speed, and exposing a critical layer of the apparatus by utilizing the lithographic scanner at a second speed, where the first speed is substantially greater than the second speed.

The present disclosure also introduces an apparatus comprising means for exposing a dummy field and a production field on a substrate by utilizing a lithographic scanner at a first speed to expose the dummy field and at a second speed to expose the production field, where the first speed is substantially greater than the second speed.

Another apparatus introduced in the present disclosure comprises means for exposing a critical layer and a non-critical layer on a substrate in the manufacture of a microelectronic device by utilizing a lithographic scanner at a first speed to expose the non-critical layer and at a second speed to expose the critical layer, where the first speed is substantially greater than the second speed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a microelectronic apparatus, comprising:
   exposing a pattern in a dummy field on a substrate by utilizing a lithographic scanner at a first speed; and
   exposing the same pattern in a production field on the substrate by utilizing the lithographic scanner at a second speed;
   wherein the first speed is substantially greater than the second speed, and wherein the dummy field comprises an exposure area that overlaps an outermost edge of the substrate, and further wherein the production field comprises an exposure area that lies completely within the outermost edge of the substrate, further wherein the pattern extends to the outermost edge of the substrate.

2. The method of claim 1 wherein the first speed and the second speed are each a speed of the substrate and at least a portion of the lithographic scanner relative to each other.

3. The method of claim 1 wherein the first speed is at least about 50% greater than the second speed.

4. The method of claim 1 wherein the first speed is at least about 100% greater than the second speed.

5. The method of claim 1 wherein the first speed is about 720 mm/second and the second speed is about 360 mm/second.

6. The method of claim 1 wherein exposing the dummy field on the substrate comprises exposing a layer on the substrate, and wherein exposing the production field on the substrate comprises exposing the same layer.

7. A method of manufacturing microelectronic devices on a substrate including a plurality of layers, the method comprising:

exposing a non-critical layer by utilizing a lithographic scanner at a first speed;

exposing a pattern in a production field of a critical layer by utilizing the lithographic scanner at a second speed; and exposing the same pattern in a dummy field of the critical layer by utilizing the lithographic scanner at a third speed, wherein the first speed and the third speed are substantially greater than the second speed, and wherein the dummy field comprises an exposure area that overlaps an outermost edge of the substrate, and further wherein the production field comprises an exposure area that lies completely within the outermost edge of the substrate, further wherein the pattern extends to the outermost edge of the substrate.

8. The method of claim 7 wherein the first speed and the second speed are each a speed of the substrate and at least a portion of the lithographic scanner relative to each other.

9. The method of claim 7 wherein the first speed is at least about 50% greater than the second speed.

10. The method of claim 7 wherein the first speed is at least about 100% greater than the second speed.

11. The method of claim 7 wherein the first speed is about 720 mm/second and the second speed is about 360 mm/second.

12. An apparatus, comprising:

means for exposing a pattern in a dummy field on a substrate at a first speed; and means for exposing the same pattern in a production field on the substrate at a second speed, wherein the first speed is substantially greater than the second speed, and wherein the dummy field comprises an exposure area that overlaps an outermost edge of the substrate, and further wherein the production field comprises an exposure area that lies completely within the outermost edge of the substrate, further wherein the pattern extends to the outermost edge of the substrate.

13. The apparatus of claim 12 wherein the first speed and the second speed are each a speed of the substrate and at least a portion of the lithographic scanner relative to each other.

14. The apparatus of claim 12 wherein the first speed is at least about 50% greater than the second speed.

15. The apparatus of claim 12 wherein the first speed is at least about 100% greater than the second speed.

16. The apparatus of claim 12 wherein the first speed is about 720 mm/second and the second speed is about 360 mm/second.

17. The apparatus of claim 12 wherein exposing the dummy field on the substrate comprises exposing a layer on the substrate, and wherein exposing the production field on the substrate comprises exposing the same layer.

18. An apparatus for manufacturing microelectronic devices on a substrate including a plurality of layers, comprising:

means for exposing a non-critical layer on the substrate at a first speed;

means for exposing a pattern in a production field of a critical layer on the substrate at a second speed; and means for exposing the same pattern in a dummy field of the critical layer of the substrate at a third speed, wherein the first speed and the third speed are substantially greater than the second speed , and wherein the dummy field comprises an exposure area that overlaps an outermost edge of the substrate, and further wherein the production field comprises an exposure area that lies completely within the outermost edge of the substrate, further wherein the pattern extends to the outermost edge of the substrate.

19. The apparatus of claim 18 wherein the first speed and the second speed are each a speed of the substrate and at least a portion of the apparatus relative to each other.

20. The apparatus of claim 18 wherein the first speed is at least about 50% greater than the second speed.

21. The apparatus of claim 18 wherein the first speed is at least about 100% greater than the second speed.

22. The apparatus of claim 18 wherein the first speed is about 720 mm/second and the second speed is about 360 mm/second.

* * * * *